US006780695B1

(12) United States Patent
Chen et al.

(10) Patent No.: US 6,780,695 B1
(45) Date of Patent: Aug. 24, 2004

(54) BICMOS INTEGRATION SCHEME WITH RAISED EXTRINSIC BASE

(75) Inventors: Huajie Chen, Wappingers Falls, NY (US); Seshadri Subbanna, Brewster, NY (US); Basanth Jagannathan, Beacon, NY (US); Gregory G. Freeman, Hopewell Junction, NY (US); David C. Ahlgren, Wappingers Falls, NY (US); David Angell, Poughkeepsie, NY (US); Kathryn T. Schonenberg, Wappingers Falls, NY (US); Kenneth J. Stein, Sandy Hook, CT (US); Fen F. Jamin, Wappingers Falls, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/249,563

(22) Filed: Apr. 18, 2003

(51) Int. Cl.$^7$ .......................................... H01L 21/8238
(52) U.S. Cl. ........................ 438/202; 438/207; 438/349
(58) Field of Search ................................ 438/202–207, 438/349

(56) References Cited

U.S. PATENT DOCUMENTS 5,304,501 A * 4/1994 Tong .......................... 438/207
6,117,717 A * 9/2000 Carbone et al. ............ 438/202
6,667,202 B2 * 12/2003 Suzuki ....................... 438/202

* cited by examiner

*Primary Examiner*—George Fourson
*Assistant Examiner*—Thanh V Pham
(74) *Attorney, Agent, or Firm*—Scully, Scott, Murphy & Presser; Joseph P. Abate

(57) ABSTRACT

A method of forming a BiCMOS integrated circuit having a raised extrinsic base is provided. The method includes first forming a polysilicon layer atop a surface of a gate dielectric which is located atop a substrate having device areas for forming at least one bipolar transistor and device areas for forming at least one complementary metal oxide semiconductor (CMOS) transistor. The polysilicon layer is then patterned to provide a sacrificial polysilicon layer over the device areas for forming the at least one bipolar transistor and its surrounding areas, while simultaneously providing at least one gate conductor in the device areas for forming at least one CMOS transistor. At least one pair of spacers are then formed about each of the at least one gate conductor and then a portion of the sacrificial polysilicon layer over the bipolar device areas are selectively removed to provide at least one opening in the bipolar device area. At least one bipolar transistor having a raised extrinsic base is then formed in the at least one opening.

17 Claims, 22 Drawing Sheets

BICMOS INTEGRATION SCHEME WITH RAISED EXTRINSIC BASE

BACKGROUND OF INVENTION

The present invention generally relates to integrated circuits, and more specifically to a method of fabricating a BiCMOS integrated circuit having a raised extrinsic base that utilizes a sacrificial polysilicon layer in the heterojunction bipolar transistor (HBT) device area of the BiCMOS integrated circuit to provide an HBT device area and a complementary metal oxide semiconductor (CMOS) transistor device area which have substantially the same heights during the raised extrinsic base chemical-mechanical polishing (CMP) steps.

BiCMOS integrated circuits combine bipolar transistors, e.g., HBTs, and CMOS transistors on a single chip, providing a variety of functionalities and exploiting the advantages of each type of device. Thus, BiCMOS integrated circuits capitalize on the relatively fast speeds and better analog performance of the bipolar transistors, while exploiting the low power dissipation and high packing density of CMOS transistors.

High-base resistance and high parasitic capacitance between the collector and the base regions in bipolar transistors degrade both the minimum noise and power gain cutoff frequency. In order to reduce the base resistance and parasitic capacitance of bipolar transistors, it is known to form the HBT on a raised extrinsic base; See, for example, co-assigned U.S. application Ser. No. 09/962,732, filed Sep. 25, 2001. The raised extrinsic base in prior art bipolar transistors is formed by utilizing a CMP process. However, when it comes to SiGe BiCMOS structures, there is a topographic issue for CMP since the CMOS gate polysilicon creates a thickness difference, which is similar to the gate height (typically 100–250 nm) between the CMOS device area and the bipolar transistor device area. The height of these two device areas must be adjusted to the same level for the raised extrinsic base CMP.

In one prior art process, se, for example, U.S. Pat. No. 6,492,238 B1, a BiCMOS having a raised extrinsic base region is formed using a reactive-ion etch (RIE) step to etch part of the film on top of the CMOS gate to make the CMOS transistor and bipolar transistor device areas substantially level. Despite being capable of leveling the two device areas, this prior art approach for adjusting the height differential between the HBT and the CMOS transistor device areas is extremely complicated and requires two additional lithographic levels to achieve leveling between the device areas of the CMOS transistor and the HBT.

In view of the drawbacks mentioned with prior art BiCMOS integrated circuit devices having a raised extrinsic base, there is a need for providing a new and improved BiCMOS integration scheme which provides a raised extrinsic base wherein the height of the HBT device area is substantially the same as the height of the CMOS transistor device area. Such an integration scheme should reduce the complexity of the prior art RIE approach as well as reduce the number of lithographic levels that are needed for accomplishing the same.

SUMMARY OF INVENTION

One object of the present invention is to provide a method of fabricating a BiCMOS integrated circuit having a raised extrinsic base.

Another object of the present invention is to provide a method of fabricating a BiCMOS integrated circuit that has reduced base resistance as well as reduced parasitic capacitance.

A further object of the present invention is to provide a method of fabricating a BiCMOS integrated circuit in which the device area height of the HBT and the CMOS transistor are substantially the same in an interim stage during the raised extrinsic base CMP steps.

A yet further object of the present invention is to provide a method of fabricating a BiCMOS integrated circuit in which a simple integration scheme is used in forming the same.

A still further object of the present invention is to provide a method of fabricating a BiCMOS integrated circuit in which fewer lithographic levels than the prior art RIE leveling scheme described above are needed.

An even further object of the present invention is to provide a method of fabricating a BiCMOS integrated circuit in which the problem associated with narrow spacing between CMOS gates is eliminated.

These and other advantages and objects are achieved in the present invention by forming a BiCMOS integrated circuit having a raised extrinsic base in which a sacrificial polysilicon layer is formed in the HBT device area during the CMOS gate formation. Following CMOS gate formation, a portion of the sacrificial polysilicon layer in the HBT area is removed and thereafter the HBT is formed in the region previously occupied by the removed portion of sacrificial polysilicon. It is noted that after gate formation, but prior to HBT formation, the spaces between each adjacent gate may be filled with a polysilicon placeholder material thereby eliminating the problem associated with narrow spacing between the gates.

Specifically, the present invention provides a method, i.e., a BiCMOS integration scheme, which comprises the steps of:

forming a polysilicon layer atop a surface of a gate dielectric which is located atop a substrate, said substrate having a device area for forming at least one bipolar transistor and a device area for forming at least one complementary metal oxide semiconductor (CMOS) transistor;

patterning said polysilicon layer to provide a sacrificial polysilicon layer over said device area for forming the at least one bipolar transistor, while simultaneously providing at least one gate conductor in said device area for forming at least one CMOS transistor;

forming at least one pair of spacers about each of the at least one gate conductor to provide said at least one CMOS transistor;

selectively removing a portion of said sacrificial polysilicon layer over said device area for forming the at least one bipolar transistor to provide at least one opening; and forming the at least one bipolar transistor having a raised extrinsic base in the at least one opening.

In an optional embodiment of the present invention, any spaces between the CMOS transistors are filled to prevent problems associated with narrowing of the device spacing during fabrication of the HBT.

BRIEF DESCRIPTION OF DRAWINGS

These and other objects, features and advantages of the present invention will become apparent from the following detailed description and appended drawings in which.

DETAILED DESCRIPTION

Figure 1:
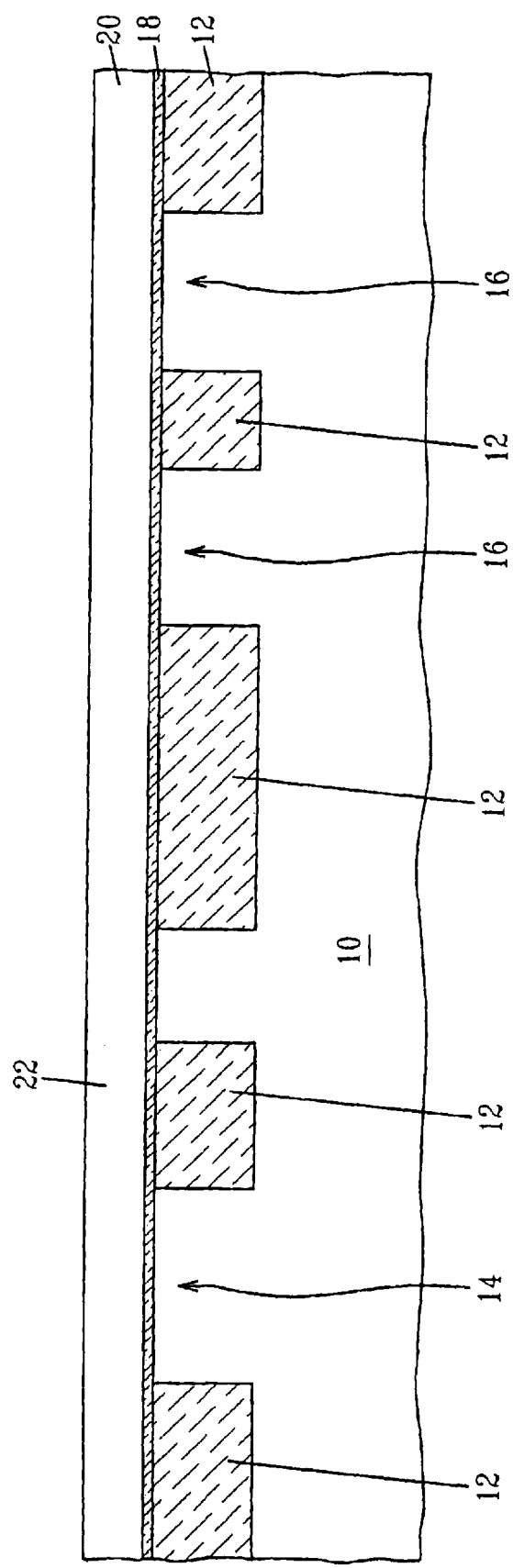
FIGS. 1–20 are pictorial representations (through cross sectional views) illustrating the basic processing steps that are employed in the present invention.

The present invention, which provides an integration scheme for fabricating a BiCMOS integrated circuit in which the HBT device area is substantially the same height as the CMOS transistor device area during raised extrinsic base CMP steps, will now be described in greater detail by referring to the drawings that accompanying the present application.

The drawings and discussion that follow only describe the structural fabrication, all implants and anneals have been omitted for the sake of clarity. It is submitted that any conventional implants and anneals that are typically used in forming a BiCMOS having a raised extrinsic base could be implemented in the present invention. These implants and anneals are performed at customary times throughout the integration scheme of the present invention.

Reference is first made to FIG. 1 which is a cross sectional view of an initial structure that is employed in the present invention. The initial structure shown in FIG. 1 includes a substrate 10 having isolation regions 12 formed therein. A gate dielectric 18 is located atop an upper surface of substrate 10, and a polysilicon layer 20 is located atop gate dielectric 18. The substrate 10 includes at least one device area for forming at least one bipolar transistor and at least one device area for forming at least one complementary metal oxide semiconductor (CMOS) transistor. The bipolar transistor device area is labeled as reference numeral 14, while the CMOS transistor device area is labeled as 16. In the drawings to follow, a single bipolar transistor will be fabricated, while two CMOS transistors will be fabricated. It is noted that the number of bipolar transistors and CMOS transistors that can be formed is not limited to the number that is specifically shown. Rather, a plurality of each type of transistors (HBT and CMOS) is contemplated in the present invention.

The substrate 10 of the initial structure shown in FIG. 1 may be comprised of a conventional semiconducting material including, for example, Si, Ge, SiGe, GaAs, InAs, InP and other III/V compound semiconductors. Layered semiconductors comprising the same or different semiconducting material such as epi-Si/Si, epi-Si/SiGe and silicon-on-insulator (SOI) may also be employed in the present invention. In the present invention, substrate 10 is preferably a layered semiconductor comprising epi-Si/Si.

As shown, the substrate 10 includes a plurality of isolation regions 12 formed therein. The various isolation regions 12 may include trench isolation regions, as is shown, or local oxidation of silicon (LOCOS) isolation regions. The LOCOS isolation regions are formed utilizing a local oxidation of silicon process. The trench isolation regions are formed utilizing processes that are well-known to those skilled in the art. Deep trench isolation may also be used in between bipolar transistors in combination with shallow trench isolation.

Gate dielectric 18 is then formed atop a surface of substrate 10 utilizing a thermal oxidation, nitridation or oxynitridation process. Alternatively, the gate dielectric 18 may be formed by a deposition process such as, but not limited to: chemical vapor deposition (CVD), plasma-assisted CVD, chemical solution deposition, evaporation, atomic layer deposition and other like deposition processes. The gate dielectric 18 may be comprised of an insulating oxide, nitride, oxynitride, a high-k dielectric, or any combination thereof including multilayers. The thickness of the gate dielectric 18 may vary, but typically the gate dielectric 18 has a thickness of from about 0.5 to about 10 nm.

Following application of the gate dielectric 18, a polysilicon layer 20 is formed atop a surface of the gate dielectric 18 utilizing a conventional deposition process such as, for example, CVD or plasma-assisted CVD. The thickness of the polysilicon layer 20 may vary, but typically the polysilicon layer 20 has a thickness of from about 100 to about 250 nm. A portion of the polysilicon layer 20 that is located atop the HBT device area 14 serves as a sacrificial polysilicon layer, which protects the HBT device area 14 during fabrication of the CMOS transistor(s). Portions of the polysilicon layer 20 in the CMOS transistor device area 16 may be used as either the gate conductor of a CMOS transistor or as a fill.

After providing the structure shown in FIG. 1, a hard mask and a photoresist (not shown) are first applied atop the polysilicon layer 20 and thereafter the photoresist is patterned using a lithographic step which includes resist exposure and development. After patterning the photoresist, the pattern is transferred to the underlying hard mask using a RIE process, and the patterned photoresist is removed. The pattern is then transferred to the polysilicon layer 20 utilizing RIE. Following the etching step, the hard mask is removed, providing the structure shown, for example, in FIG. 2. In the drawing, reference numeral 22 denotes the sacrificial polysilicon layer which is located atop the HBT device area 14, while reference numerals 24 and 24" denote polysilicon gate conductors. The sacrificial polysilicon layer 22 in the HBT device area 14 ensures that the HBT device area 14 and the CMOS transistor device area 16 are substantially level during raised extrinsic base CMP steps.

Figure 2:
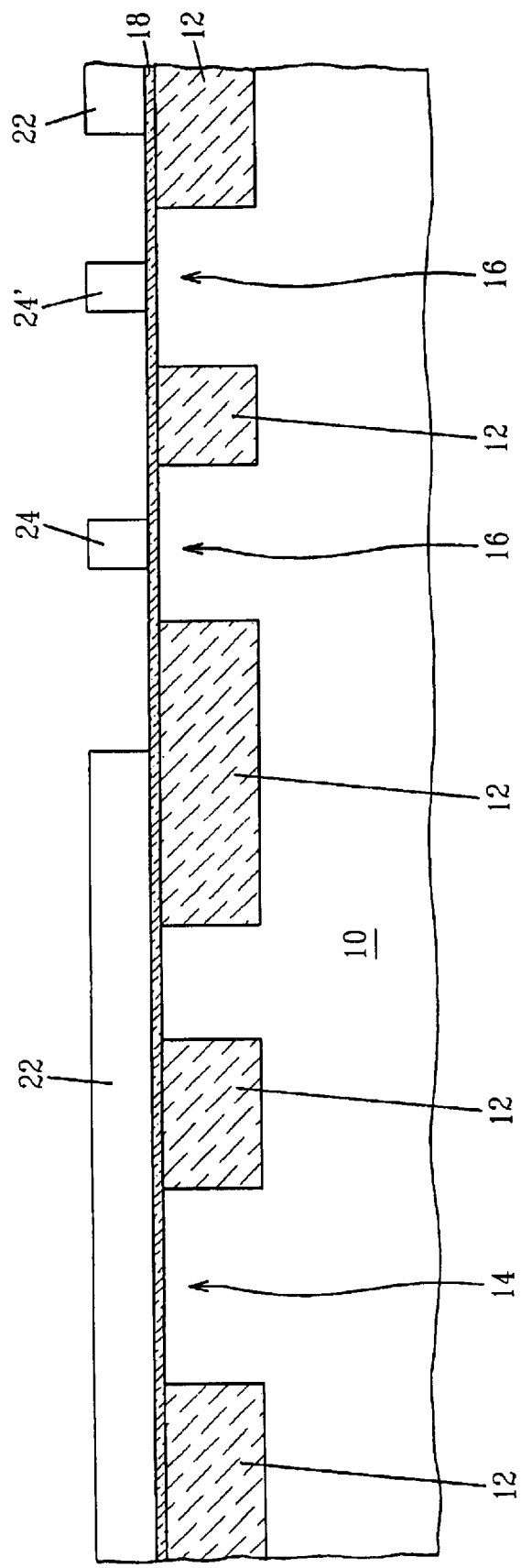

After providing the structure shown in FIG. 2, an oxide layer 26 is formed on all exposed vertical and horizontal surfaces of polysilicon. The oxide layer 26 is formed utilizing a conventional deposition process such as CVD or plasma-assisted CVD, or alternatively, a thermal oxidation process is used in forming the same. Typically, the oxide layer 26 has a thickness of from about 2 to about 15 nm.

Following formation of the oxide layer 26, a nitride layer (or multilayer) 28 is formed atop the oxide layer 26 as well as the gate dielectric 18. The nitride layer 28 may be formed by a conventional deposition process, such as CVD or plasma-assisted CVD. Typically, the nitride layer 28 has a thickness of from about 20 to about 70 nm. The nitride layer 28 serves as a CMP stop in the optional poly Si CMP step illustrated in FIG. 4; it also serves to protect the CMOS area during HBT fabrication. It is noted that a RIE step will be performed on the nitride layer 28 in a later stage and the remaining nitride on the side wall of the CMOS gate forms part of the CMOS spacer. Next, an optional oxide layer is deposited via a deposition process such as CVD on the nitride layer 28 and then the oxide layer is etched selective to nitride to provide oxide spacers 30. The oxide spacers 30 are typically comprised of TEOS. Alternatively, a nitride layer can be deposited on the polysilicon layer 20 before the gate is formed, and the nitride on top of polysilicon can serve as a CMP stop and a CMOS protecting layer. In such a case, the nitride layer 28 is not necessary, and a variety of CMOS spacers can be used.

Figure 3:
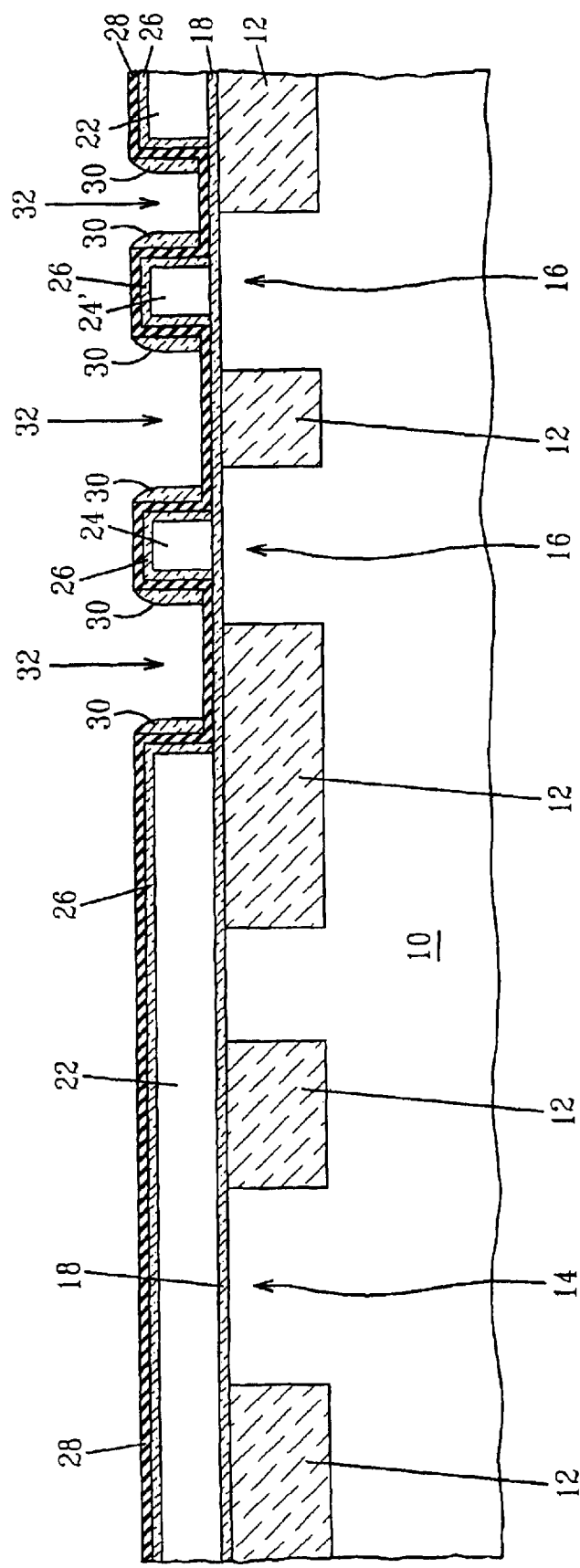

The resultant structure including the oxide spacers 30, the nitride layer 28 and the oxide layer 26 is shown in FIG. 3. In FIG. 3, reference numeral 32 is used to denote the spaces that exist between each of the polysilicon gates.

Figure 4:
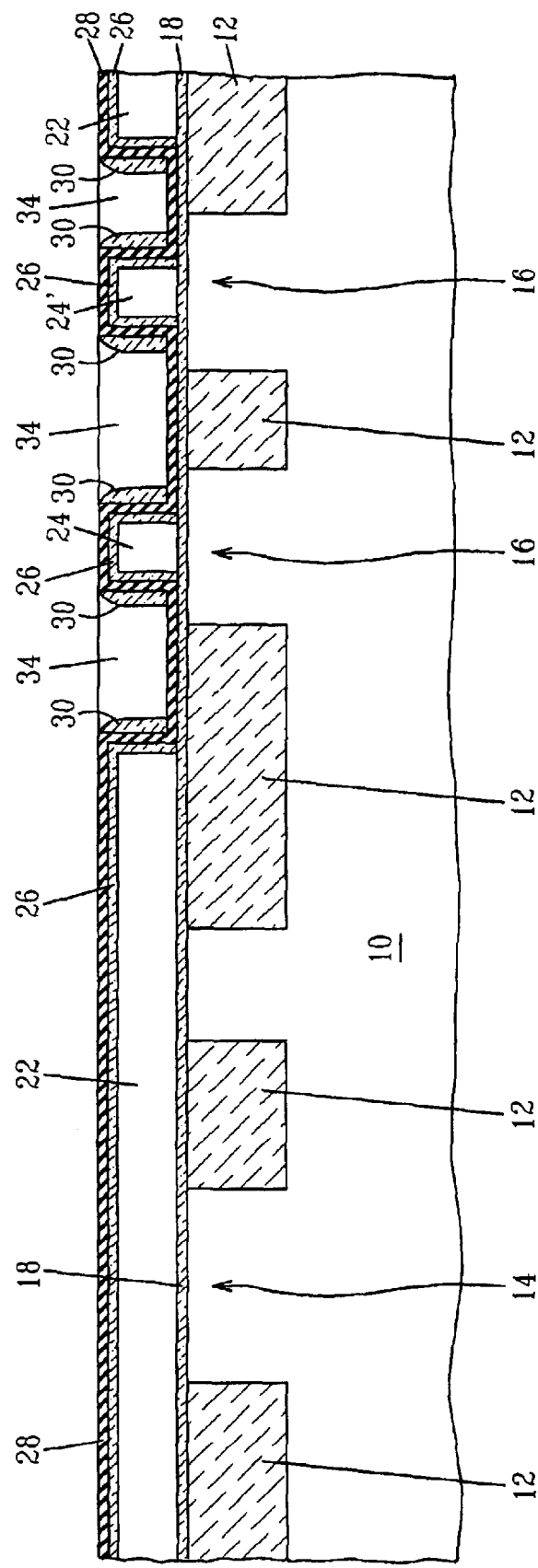

FIG. 4 shows the structure that is formed after an optional step of filling the spaces 32 with a polysilicon placeholder material 34. The polysilicon placeholder material 34 is formed by a conventional deposition process, such as CVD, and thereafter the deposited polysilicon placeholder material 34 is planarized by CMP stopping on the nitride layer 28. There could be some residue polysilicon left on the nitride layer 28, due to topography caused by the isolation regions 12. If any residue polysilicon remains atop the nitride layer 28, a polysilicon recess etching process may be performed at this point of the present invention, or at a later stage of the integration scheme of the present invention.

As stated above, the step of filling the spaces 32 with a polysilicon placeholder material 34 is optional. Although it is optional, the remaining drawings retain the polysilicon placeholder material 34 since it eliminates the problem in later processes associated with narrow and varied spacing between the CMOS gates, and it also simplifies the raised extrinsic base CMP steps since the entire wafer is at substantially the same height except the opening for forming the raised extrinsic base. It is noted that although the polysilicon placeholder material 34 is shown to be present in the drawings until its specific removal the remaining processing steps can also be used when the polysilicon placeholder material 34 is absent, except that one needs a lithography and an etch step to remove TEOS and poly Si that will be present in the spaces between then CMOS gates before nitride removal illustrated in FIG. 14.

Figure 5:
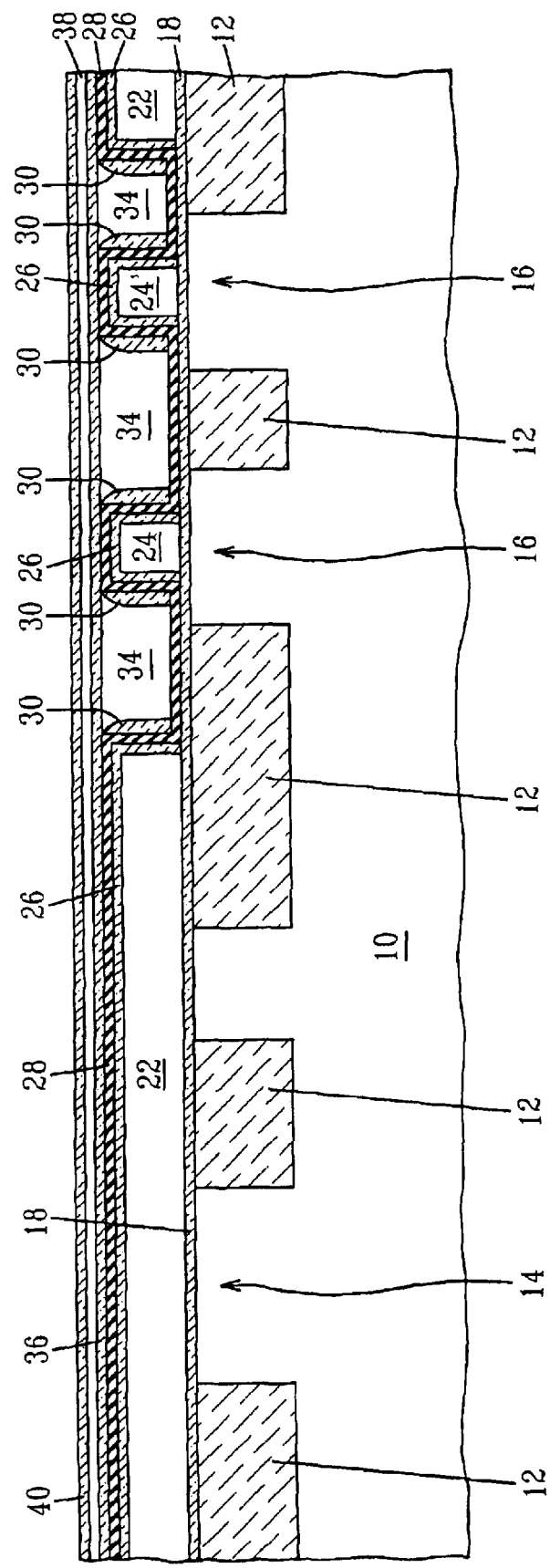

To either the structure shown in FIG. 3 or FIG. 4, a protecting oxide layer hereinafter referred to as second oxide layer 36 is formed on exposed surfaces using a conventional deposition process such as CVD or plasma-assisted CVD. FIG. 5 illustrates a structure in which the second oxide layer 36 is formed over the exposed surfaces of the nitride layer 28 and the polysilicon placeholder material 34. The thickness of the second oxide layer 36 may vary, but typically the second oxide layer 36 has a thickness of from about 10 to about 40 nm.

Following formation of the second oxide layer 36, a second polysilicon layer 38 is formed atop the second oxide layer 36. See, for example, the structure shown in FIG. 5. The second polysilicon layer 38 is formed utilizing a deposition process such as CVD and the thickness thereof is generally less than the thickness of the polysilicon layer 20. Specifically, the second polysilicon layer 38 has a thickness of from about 10 to about 60 nm.

An optional cap oxide layer 40 is then formed atop the second polysilicon layer 38 utilizing a conventional deposition process or a thermal oxidation process. See the structure shown, for example, in FIG. 5. The cap oxide layer 40 has a thickness of from about 10 to about 50 nm.

Figure 6:
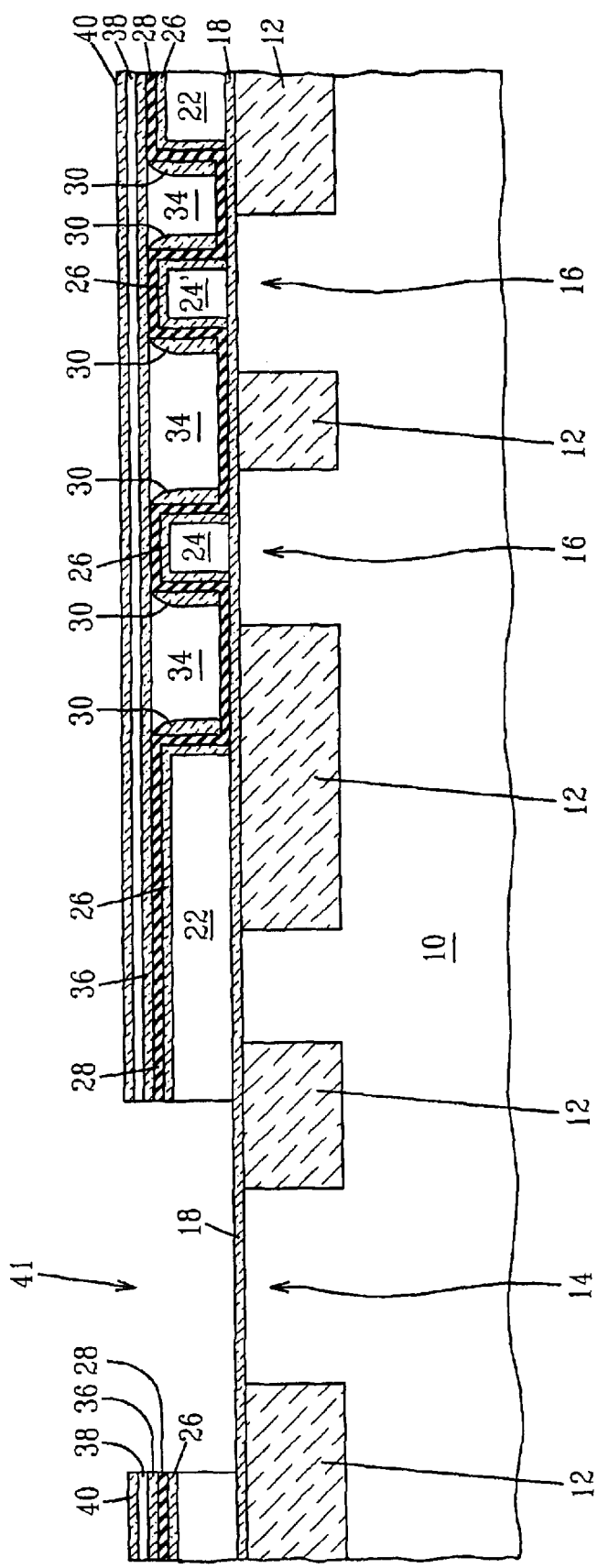

FIG. 6 shows the structure that is formed after opening 41 has been formed in portions of sacrificial polysilicon layer 22 in HBT device area 14. The formation of opening 41 involves a lithography step and a RIE step or a combination of RIE and wet chemical etching. Opening 41 defines the region in which the HBT will be subsequently formed. Note that opening 41 exposes the gate dielectric 18 that underlies the removed portion of the sacrificial polysilicon layer 22.

Figure 7:
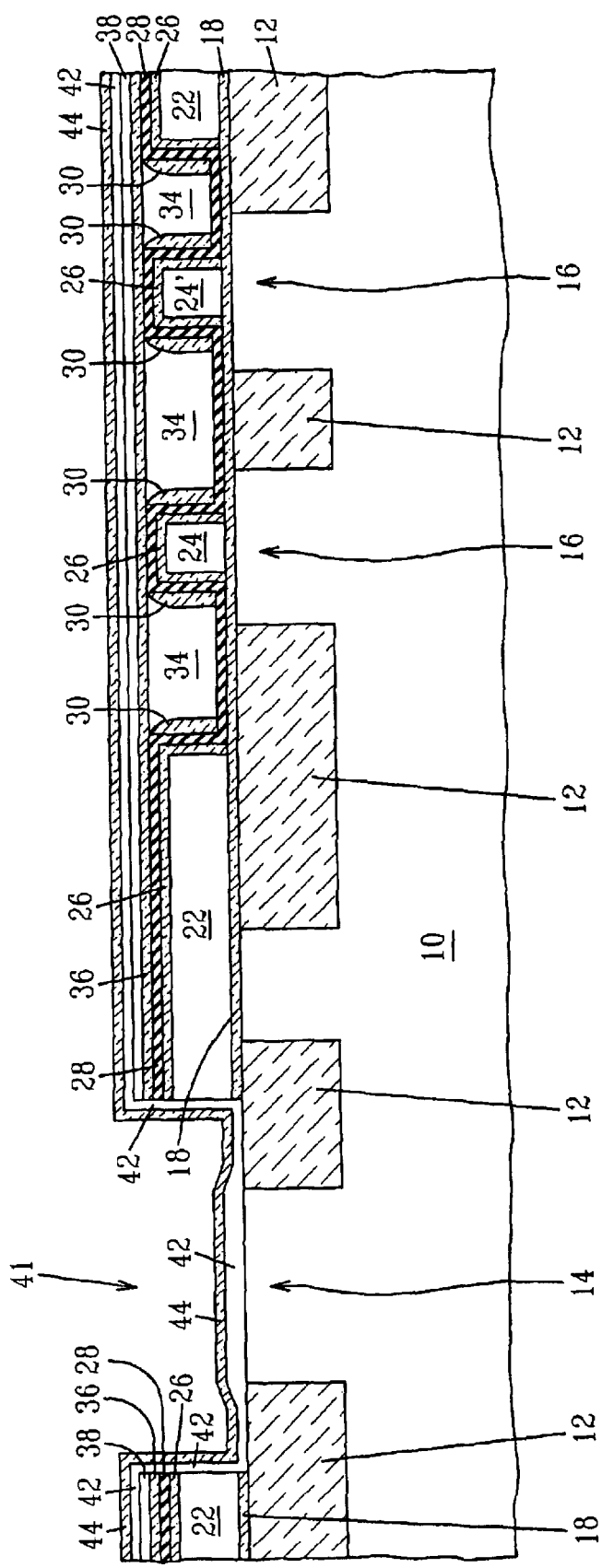

After the opening 41 has been formed, the cap oxide 40 and the exposed gate dielectric 18 in the opening 41 is removed by a wet chemical etching process. A base layer 42 is then formed on exposed surfaces of the structure using a low temperature epitaxial growth process (typically 450°–700° C.). The base layer 42 may comprise Si or SiGe or a combination of Si and SiGe; it is single crystal on top of substrate area 14 and poly crystal on top of polysilicon 38 and isolation 12. Part of base layer 42 is in-situ doped during epitaxy to form the intrinsic base. An oxide layer 44 is then formed atop the base layer 42 by utilizing a thermal oxidation or a CVD process. The resultant structure including the base layer 42 and oxide layer 44 is shown, for example, in FIG. 7.

Figure 8:
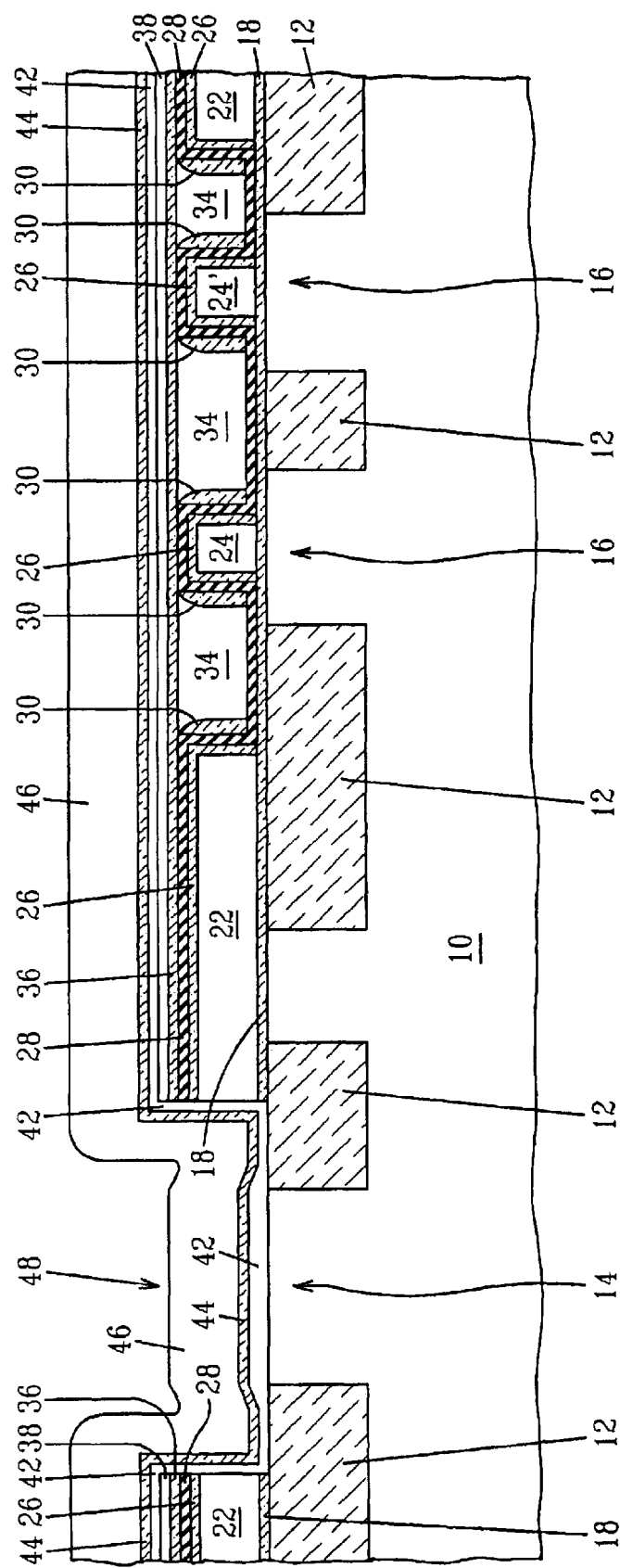

FIG. 8 shows the structure that is formed after an CVD polysilicon layer 46 has been formed atop the oxide layer 44. The polysilicon layer 46 that amasses in the opening 41 is labeled as region 48 in the drawings. Other material besides polysilicon such as nitride may be used in forming layer 46. The thickness of polysilicon layer 46 is chosen to make the top surface of layer 46 at the same height as top surface of the oxide layer 36 on the CMOS gate and the sacrificial polysilicon.

A patterned photoresist mask 50 is then formed atop region 48. The patterned mask 50 is used to protect region 48 during etching of unprotected areas of the polysilicon layer 46, the oxide layer 44, the base layer 42, and the second polysilicon layer 38. The etching step may include a single etching process, or multiple etching processes may be used in forming the structure shown, for example, in FIG. 9. Note that the second oxide layer 36 is left exposed after this step of the present invention.

Figure 9:
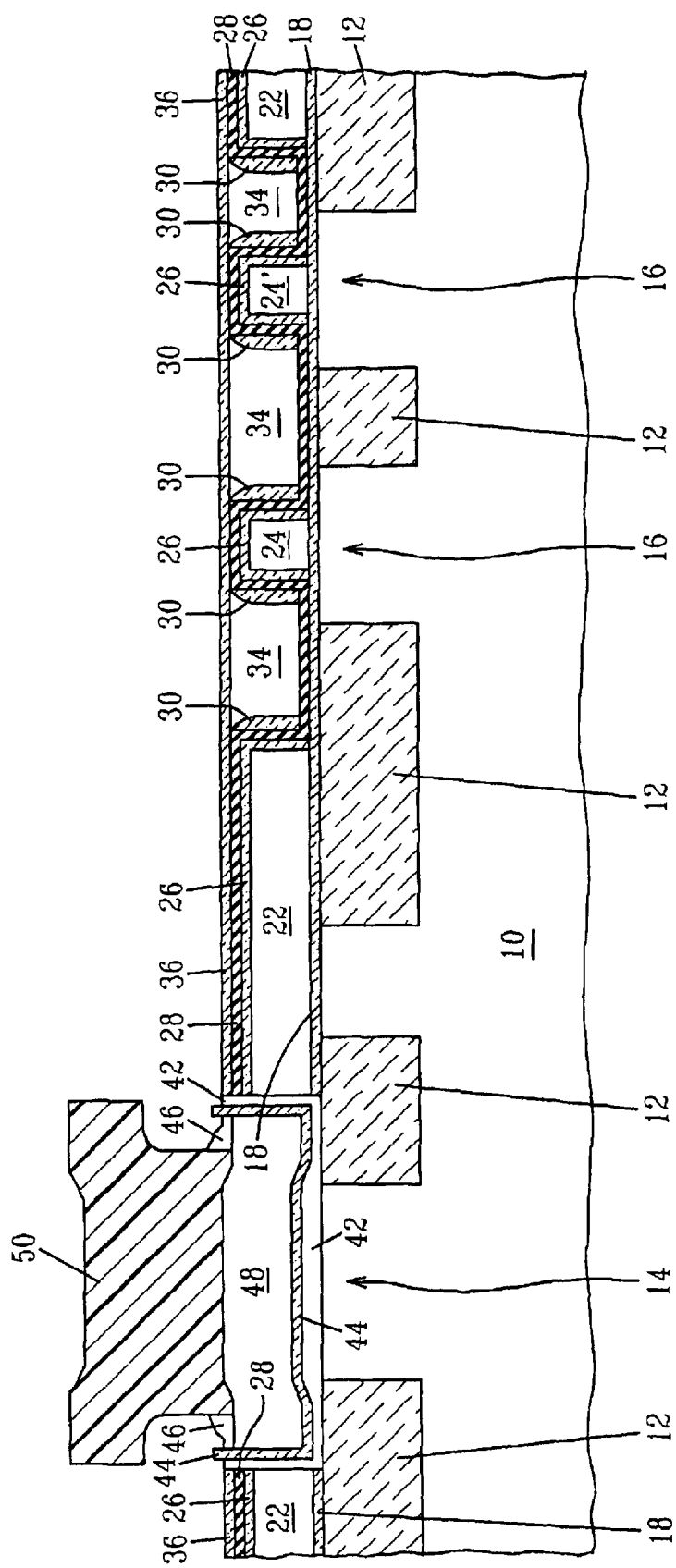
Figure 10:
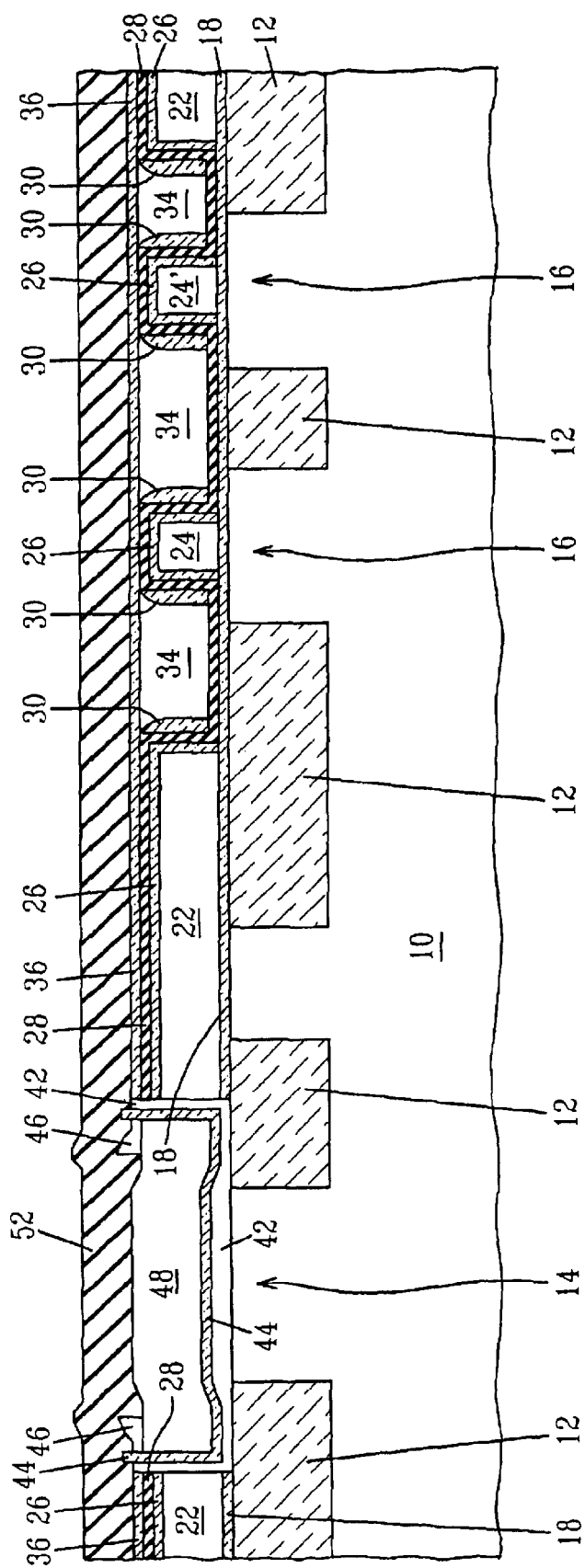

After providing the structure shown in FIG. 9, the photoresist 50 is stripped and thereafter a CMP stop layer 52 is formed providing the structure shown, for example, in FIG. 10. The CMP stop layer 52 is comprised of a nitride material which is formed by a CVD or PECVD process, and is typically 50–150 nm thick.

Figure 11:
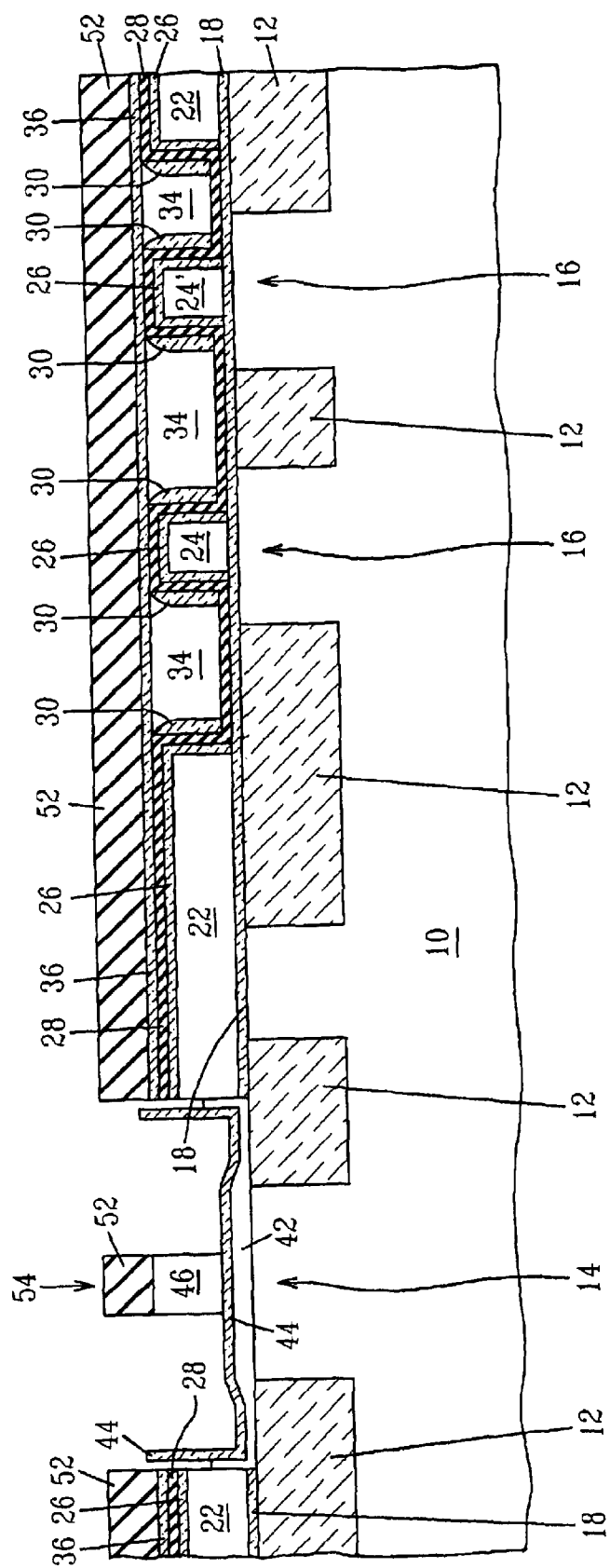

A patterned photoresist (not shown) is then formed atop the CMP stop layer 52 and an etching process is performed in the HBT device area 14 to remove selective portions of the CMP stop layer 52 as well as region 48 (i.e., polysilicon) from the structure providing the structure shown in FIG. 11. Any alignment offset caused by this step of the present invention will not present a problem. This offset is neglected here for convenience. Note that a stack of the CMP etch stop 52 and the epitixial polysilicon layer 46 remains after this etching step. The stack is labeled as 54. The emitter pedestal stack 54 is a placeholder for the emitter of the HBT.

Figure 12:
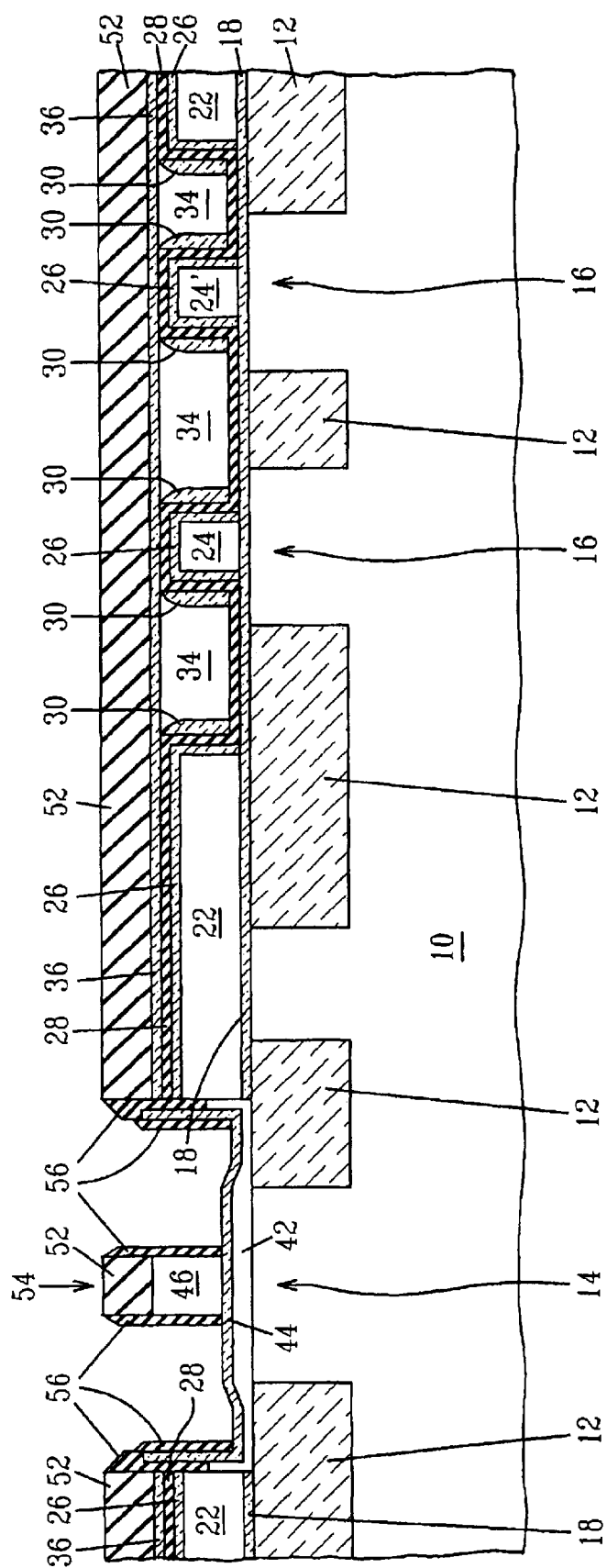

Nitride outer spacers 56 are then formed in the etched area providing the structure shown, for example, in FIG. 12. Specifically, the nitride outer spacers 56 are formed by deposition and etching. The nitride outer spacers 56 are not required if nitride is used for layer 46.

The unprotected portion of the oxide 44 that is adjoining stack 54 is removed utilizing a stripping process that is highly selectively for removing oxide as compared to nitride or polysilicon. A raised extrinsic base 58 (See, FIG. 13) is formed in areas adjoining the stack 54 by polysilicon deposition, CMP and recessing. The raised extrinsic base 58 may be comprised of polysilicon or SiGe. The recessing step used in forming the raised extrinsic base includes a timed etching process such as RIE. Alternatively, the raised extrinsic base may be formed by selective epitaxy of Si or SiGe.

Figure 13:
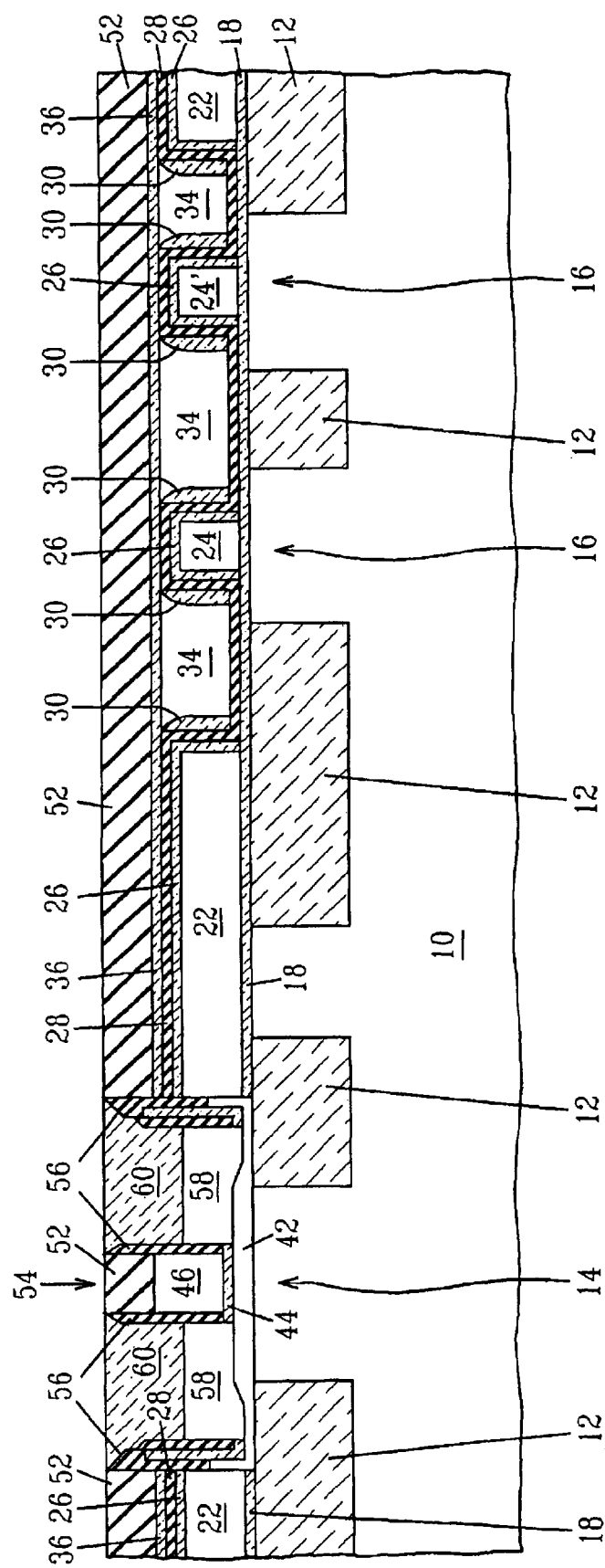

Following the formation of the raised extrinsic base 58, an oxide isolation layer 60 such as TEOS is formed atop the raised extrinsic base 58 (See, FIG. 13). The oxide isolation layer 60 is formed by deposition of an oxide, followed by CMP.

Figure 14:
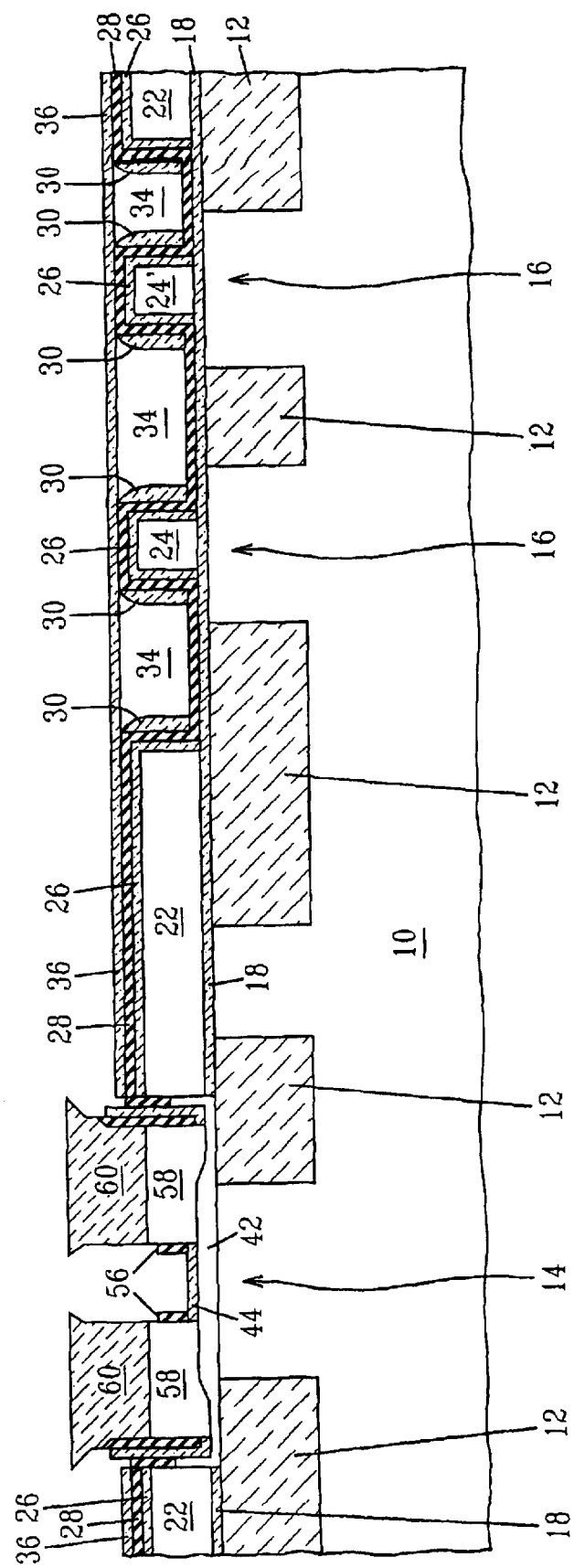

FIG. 14 shows the structure that is formed after removing the CMP stop 52 and the epitaxial polysilicon layer 46 of the stack 54. This structure is formed utilizing a nitride RIE process followed by a polysilicon RIE process. Alternatively, a hot phosphoric acid etch may be used to remove the nitride layer 52. A brief oxide etch using a wet chemical etch or RIE may be used to remove any residue oxide left on the CMP stop layer 52 prior to the CMP stop layer 52 removal.

Figure 15:
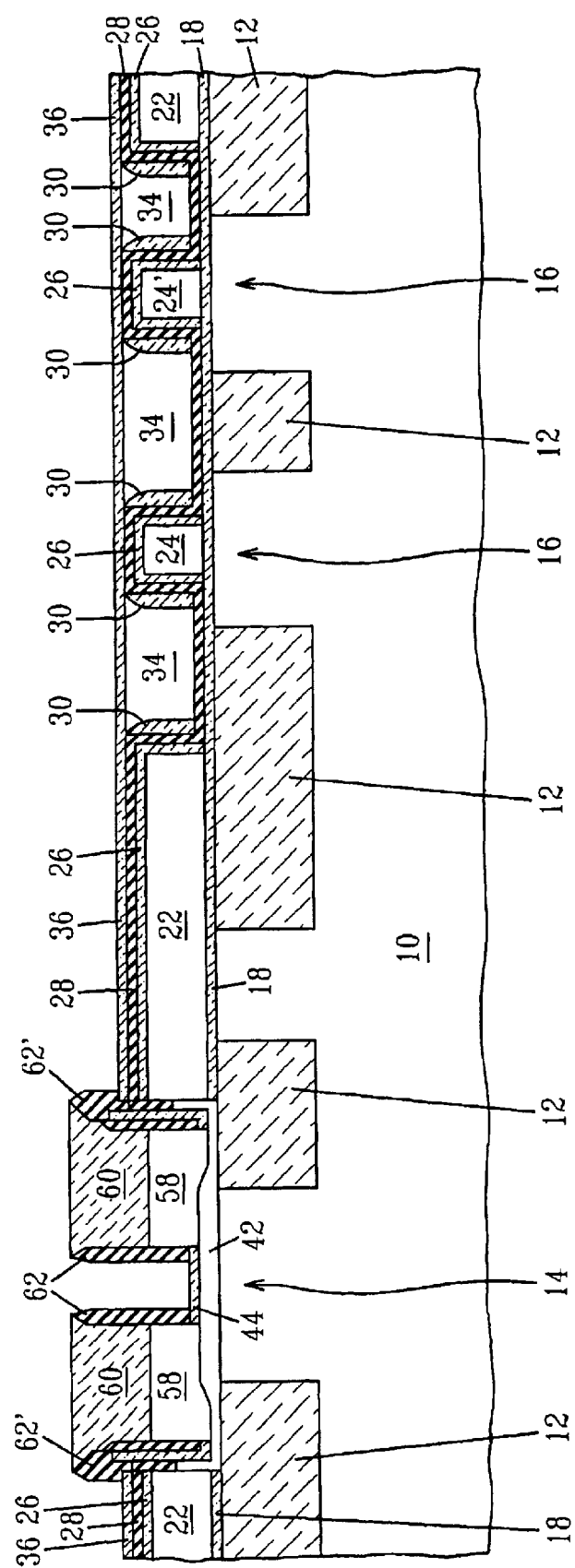

Hot phosphoric acid is then used to strip any damaged nitride spacers from the structure. Following this stripping step, the damaged nitride spacers are replaced with replacement inner nitride spacers 62. FIG. 15 shows the structure that is formed after stripping of the damaged nitride spacers and formation of the replacement inner nitride spacers 62. The replacement inner nitride spacers 62 are formed by deposition and etching. Spacers 62 typically have a thickness of 20–70 nm.

Photoresist masks 64 are formed atop the areas in which the HBT and CMOS transistors are to be located and the now exposed material layers including oxide layer 36, nitride layer 28 and oxide layer 26 are removed to expose a portion of the sacrificial polysilicon layer 22 that was not previously removed. The foregoing material layers are removed utilizing one or more selective etching processes. Any material surrounding the exposed portion of polysilicon, e.g., nitride layer 28 and 62", as well as oxide spacers 30, may be removed utilizing an isotropic RIE process so as to eliminate any fence problems. In some embodiments, the sacrificial polysilicon layer 22 is not removed; therefore lithography and the various etching steps need not be performed. However, in this case, the collector contact area 63 should not be covered by the sacrificial polysilicon layer 22.

Figure 16:
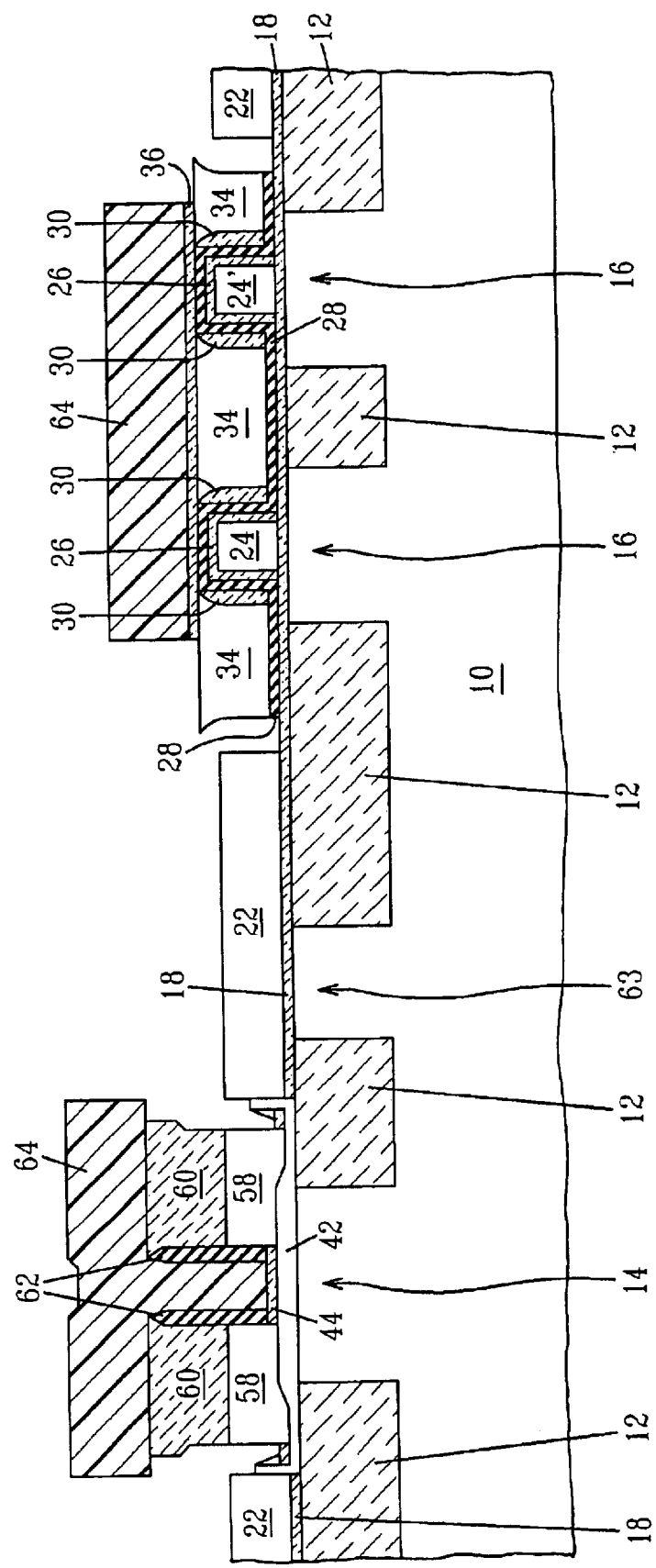

FIG. 16 shows the structure that is formed after photoresist masks 64 formation and removal of the various material layers to expose portions of the sacrificial polysilicon layer 22 that were not previously removed.

Figure 17:
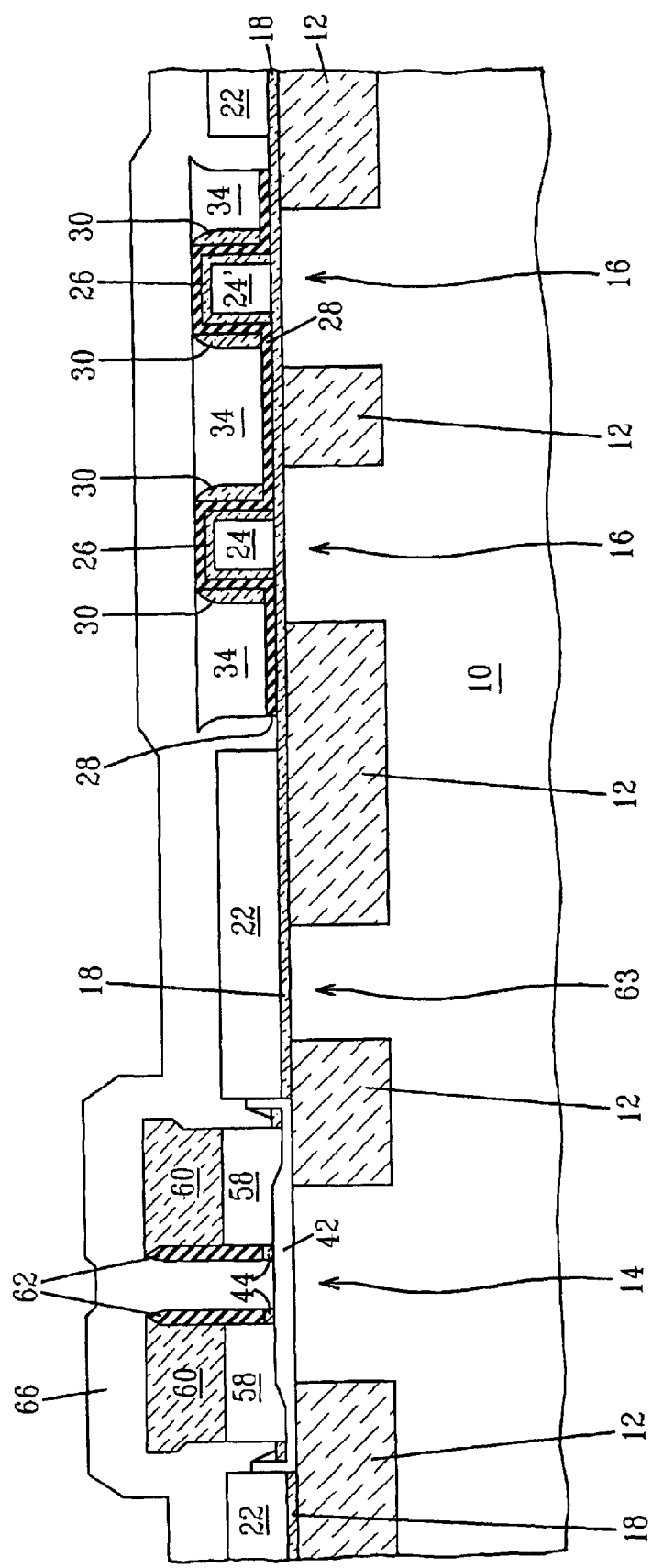

Following the various etching steps, photoresist masks 64 are removed and the oxide layer 44 that is exposed in the HBT device area 14 is removed along with the remaining oxide layer 36 utilizing a selective oxide etching process. An emitter polysilicon layer 66 is formed over the entire structure providing the structure shown, for example, in FIG. 17. The emitter polysilicon layer 66 is deposited with a CVD process and may be in-situ doped or the dopant may be introduced via ion implantation in a subsequent processing step of the present invention.

Figure 18:
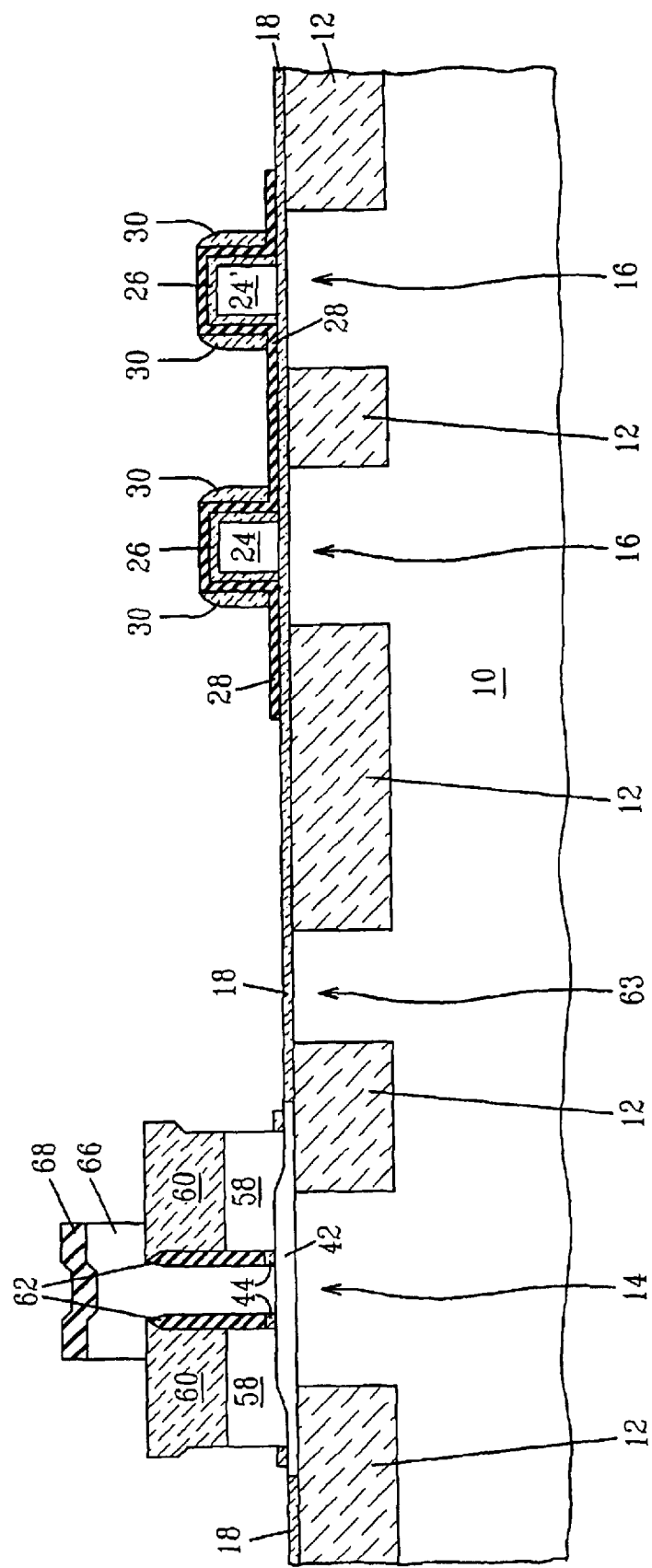

Following formation of the emitter polysilicon layer 66, a nitride layer 68 is formed atop the emitter polysilicon layer 66 utilizing a conventional deposition process. The structure containing the deposited nitride layer 68 is then patterned so that the nitride layer 68 remains only atop portions of the emitter polysilicon layer 66 that overlay the HBT device area 14. Any exposed polysilicon is then removed providing the structure shown, for example, in FIG. 18. Note that the nitride layer 28 is exposed in the CMOS transistor device area 16 following this step of the present invention.

Figure 19:
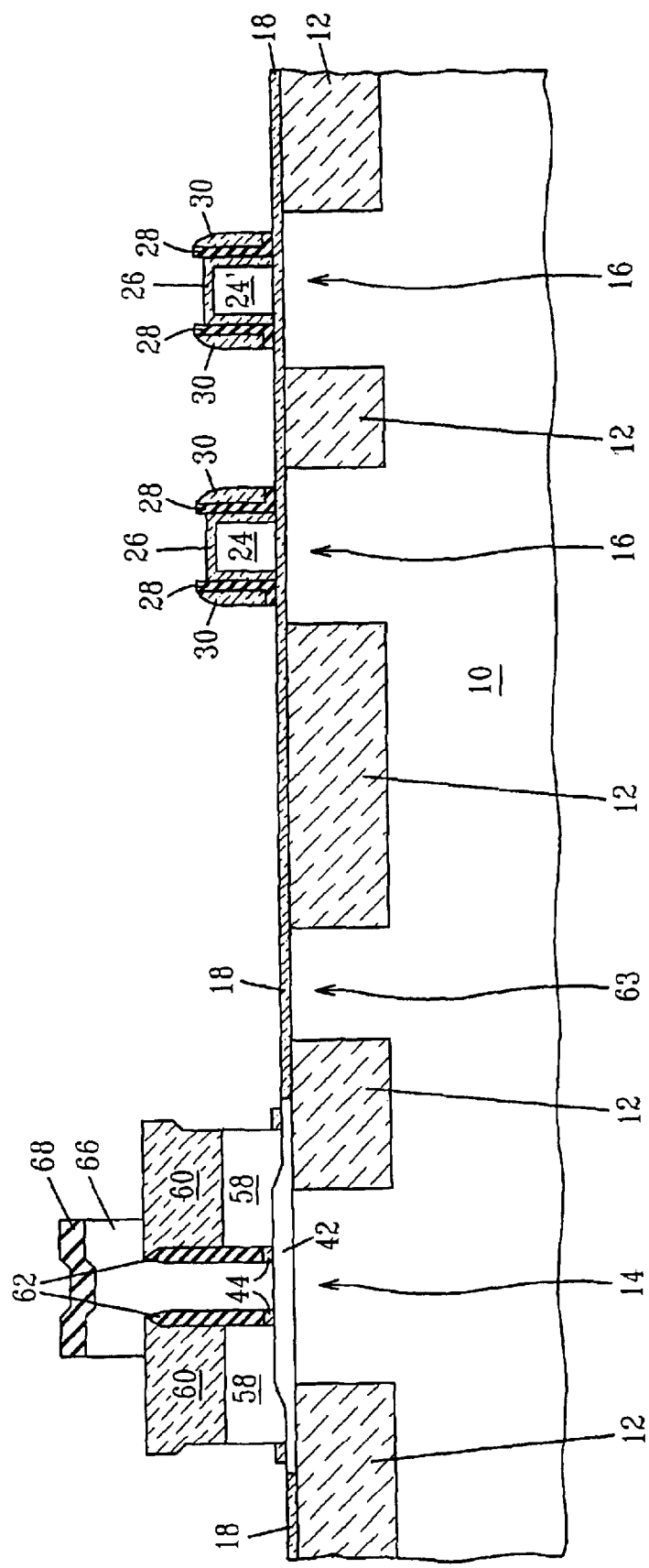

The exposed nitride layer 28 in the CMOS transistor device area 16 is then removed by a selective etching process to provide the structure shown, for example, in FIG. 19. If not previously done, source/drain regions can be formed at this point of the present invention.

Figure 20:
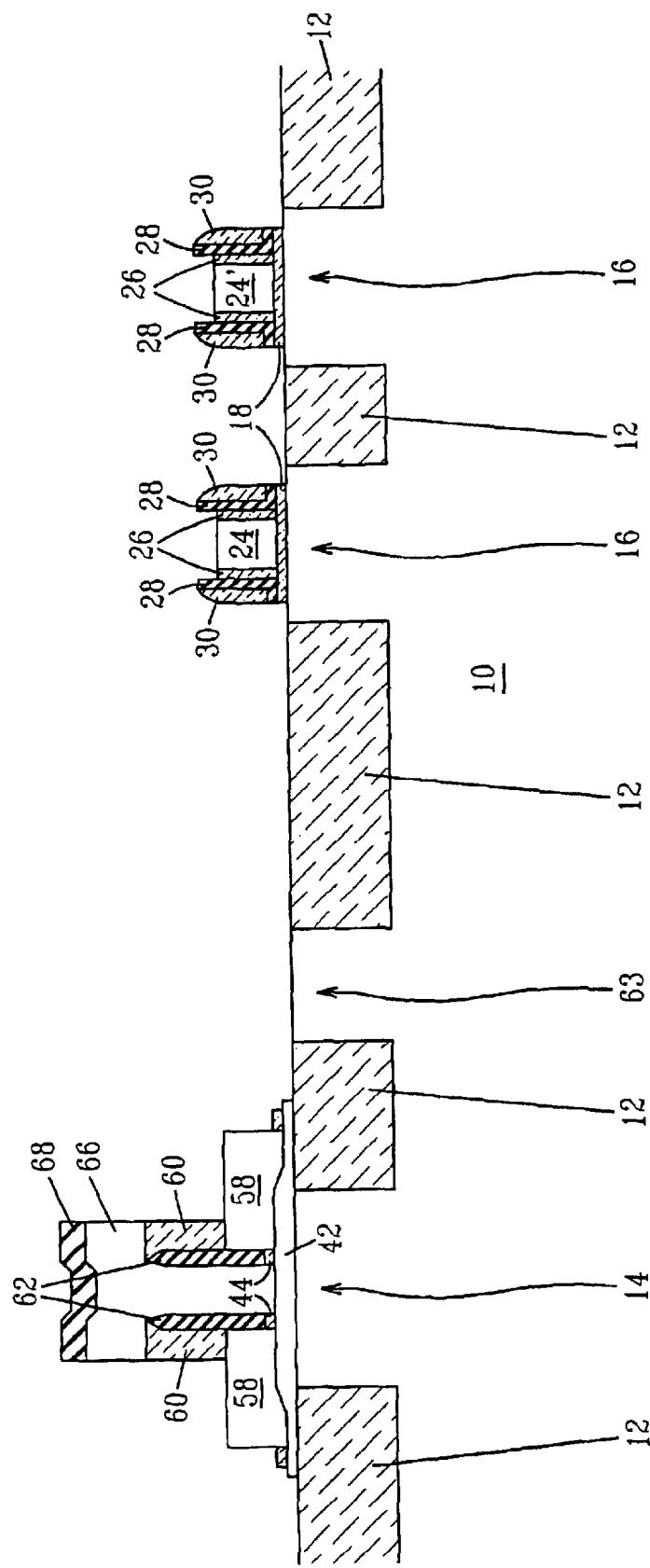

FIG. 20 shows the structure that is formed after removing exposed portions of the gate dielectric 18 from the CMOS transistor device area 16 utilizing a selective etching process. Note that that this selective etching process also removes the oxide layer 26 from the top of polysilicon gate conductors 24 and 24", if the gate dielectric 18 is an oxide. This selective etching step also etches the exposed portion of isolation oxide 60. A nitride deposition and RIE may then be performed to form a nitride spacer on the side of the emitter 66, this step may also be used to define areas for resistor formation by combining it with lithography. The structure shown in FIG. 20 may now be subjected to a salicidation process. The salicidation process forms silicide regions in areas containing exposed polysilicon. Contacts to HBT emitter, base, collector and CMOS gate and source, drain and other devices are then formed.

Figure 21:
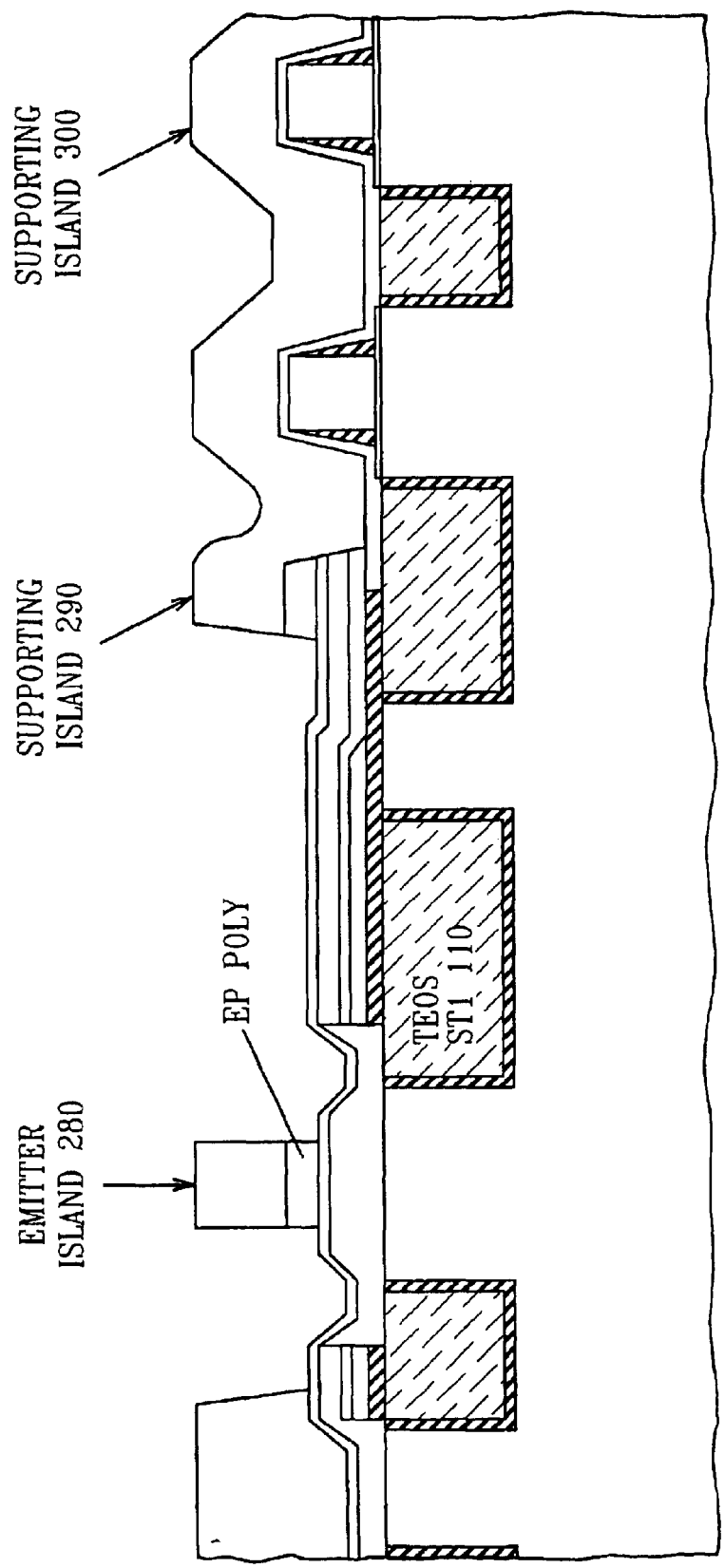
FIG. 21 is a pictorial representation (through a cross sectional view) illustrating the height difference between different areas of a BiCMOS integrated circuit fabricated by a prior art process.

FIG. 21 is a cross sectional view illustrating the height difference between different areas of a BiCMOS integrated circuit fabricated by a prior art process, See, for example, U.S. Pat. No. 6,492,238 B1. In the prior art process, there are three areas that have different film stacks which may also have different heights. The height difference between island 300 and island 290 can be set to zero in theory when optimal polysilicon thickness is chosen. However, these two islands consists of different multiple films, the normal film thickness variation of each film can cause the two islands to have a height difference of a couple hundred Angstoms. The height difference between island 290 and 280 is even more difficult to adjust.

Figure 22:
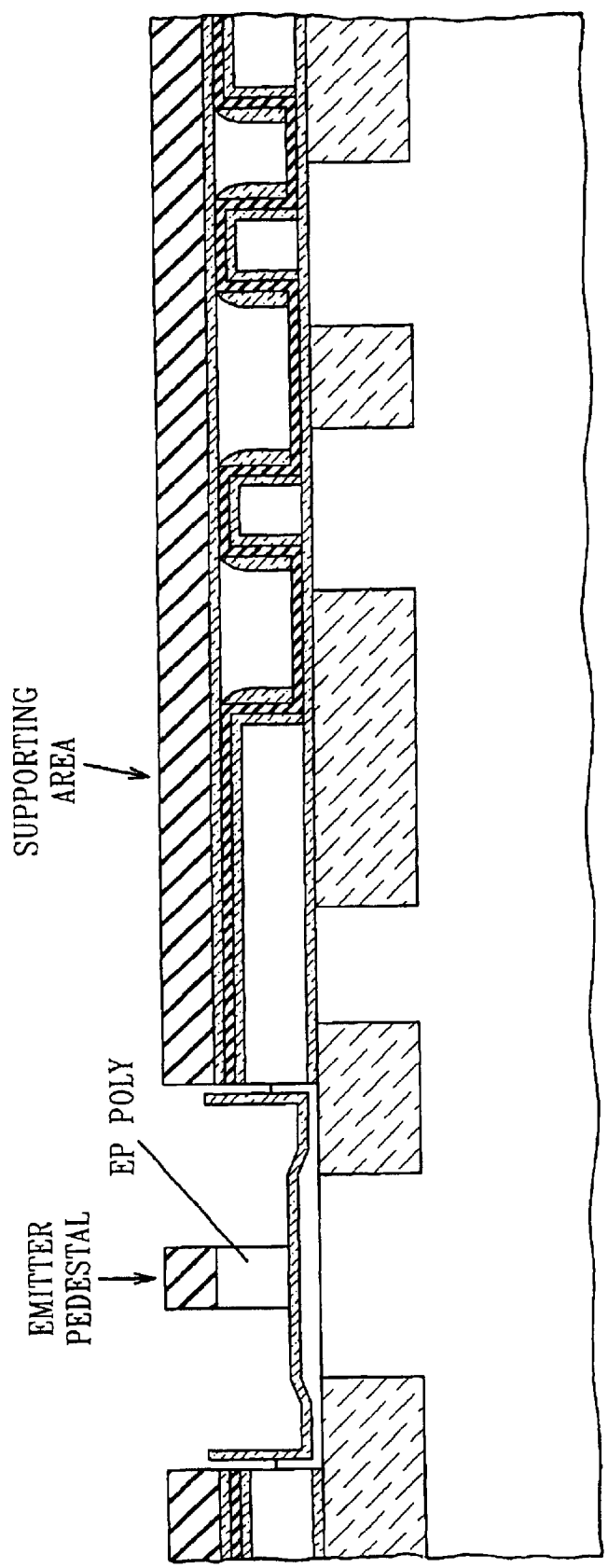
FIG. 22 is a pictorial representation (through a cross sectional view) illustrating the height difference between different areas of a BiCMOS integrated circuit fabricated by using the method of the present invention.

FIG. 22 is a pictorial representation (through a cross sectional view) illustrating the height difference between different areas of a BiCMOS integrated circuit fabricated by using the method of the present invention. Here there are only two areas that have different height, the emitter pedestal and supporting area. The height difference can be adjusted by the polysilicon thickness modification.

The advantage of using polysilicon fill between CMOS gates and sacrificial polysilicon is two fold. First, it simplifies the raised extrinsic base CMP steps as the height is substantially the same everywhere on the wafer except the opening for forming the raised extrinsic base, and one doesn't need an additional lithography and etching step to remove the remaining material between the CMOS gates and the sacrificial polysilicon left by the raised extrinsic base CMP. Secondly, without this fill, since spacing between the CMOS gates can be small and varied, after some thick film deposition during HBT processes, the remaining spacing can be so small that a thin film deposition can fill the remaining spacing, and removal of that thin film in the filled narrow spacing will require much longer etching since the film has substantially the same thickness as the CMOS gate poly thickness. By filling the spaces between the CMOS gates in an early stage, it eliminates such a potential problem.

While the present invention has particularly shown and described with respect to preferred embodiments thereof, it will be understood by one skilled in the art that the foregoing and other changes in forms and details may be made without departing from the spirit and scope of the present invention. It is therefore intended that the present invention not be limited to the exact forms and details described and illustrated, but fall within the spirit and scope of the appended claims.

What is claimed is:

1. A method of fabricating a BiCMOS integrated circuit comprising the steps of forming a polysilicon layer atop a surface of a gate dielectric which is located atop a substrate, said substrate having a device area for forming at least one bipolar transistor and a device area for forming at least one complementary metal oxide semiconductor (CMOS) transistor;

patterning said polysilicon layer to provide a sacrificial polysilicon layer over said device area for forming the at least one bipolar transistor, while simultaneously providing at least one gate conductor in said device area for forming at least one CMOS transistor;

forming at least one pair of spacers about each of the at least one gate conductor to provide said at least one CMOS transistor;

selectively removing a portion of said sacrificial polysilicon layer over said device area for forming the at least one bipolar transistor to provide at least one opening; and forming the at least one bipolar transistor having a raised extrinsic base in the at least one opening.

2. The method of claim 1 further comprising filling spaces between the patterned polysilicon layer which includes the CMOS gates and the sacrificial polysilicon layer prior to performing the selective removing step, and said filling material is removed in a later step.

3. The method of claim 1 wherein other portion of said sacrificial polysilicon layer not removed in defining the opening are removed after forming said raised extrinsic base.

4. The method of claim 1 wherein the forming the at least one bipolar transistor further comprises the steps of: forming an epitaxial layer in said at least one opening; forming an oxide atop the epitaxial layer; forming a dielectric layer atop the oxide; removing a portion of the dielectric layer not in the opening and its underlying films including the oxide layer stopping on a protecting oxide layer to make the top surface of the dielectric layer in the opening at the same height as the top surface of the protecting oxide layer on the CMOS gates and the sacrificial polysilicon; providing a CMP stop layer atop the polysilicon layer; protecting a selective portion of the CMP stop layer; removing portions of the CMP stop layer and underlying dielectric layer which are not protected for forming raised extrinsic base, and a stack surrounding this opening which holds the place that will form an emitter; removing the exposed oxide layer and forming said raised extrinsic base in areas that were removed; and forming an oxide isolation layer atop of said raised extrinsic base by first depositing a blanket oxide layer, removing oxide film on top of the CMP stop layer by using a CMP process; removing said stack and said underlying oxide; and forming an emitter polysilicon in the area previously occupied with said stack.

5. The method of claim 4 wherein said raised extrinsic base is comprised of silicon or SiGe.

6. The method of claim 4 where the raised extrinsic base is formed by first depositing a blanket extrinsic base film, removing the part of film on top of the CMP stop layer by using a CMP process, and recessing said film to a target thickness of the raised extrinsic base layer.

7. The method of claim 4 where the raised extrinsic base is formed by selective epitaxy.

8. The method of claim 4 where the CMP stop layer is nitride and where the dielectric layer deposited prior to the CMP stop layer deposition is polysilicon or nitride.

9. The method of claim 4 further comprising forming replacement inner nitride spacers on exposed sidewalls of the area previously occupied with said stack.

10. The method of claim 2 where the filling material is polysilicon and is removed during the selectively removing step to form an emitter.

11. The method of claim 2 wherein other portion of said sacrificial polysilicon layer not removed in defining the opening are removed after forming said raised extrinsic base.

12. The method of claim 2 wherein the forming the at least one bipolar transistor further comprises the steps of: forming an epitaxial layer in the at least one opening; forming an oxide atop the epitaxial layer; forming a dielectric layer atop the oxide; removing portion of the dielectric layer not in the opening and its underlying films including the oxide layer stopping on a protecting oxide layer to make the top surface of the dielectric layer in the opening at the same height as the top surface of the protecting oxide layer on the CMOS gates and the sacrificial polysilicon layer; providing a CMP stop layer atop the sacrificial polysilicon layer; protecting a selective portion of said CMP stop layer; removing portions of the CMP stop layer and underlying dielectric layer which are not protected for forming a raised extrinsic base, and a stack surrounding this opening which holds the place that will form an emitter; removing the exposed oxide layer and forming said raised extrinsic base in areas that were removed; and forming an oxide isolation layer atop of said raised extrinsic base by first depositing a blanket oxide layer, removing oxide film on top of the CMP stop layer by using a CMP process; removing said stack and said underlying oxide; and forming an emitter polysilicon in the area previously occupied with said stack.

13. The method of claim 12 wherein said raised extrinsic base is comprised of silicon or SiGe.

14. The method of claim 12 where the raised extrinsic base is formed by first depositing a blanket extrinsic base film, removing the part of film on top of CMP stop layer by using a CMP process, and recessing the said film to a target thickness of the raised extrinsic base layer.

15. The method of claim 12 where the raised extrinsic base is formed by selective epitaxy.

16. The method of claim 12 where the CMP stop layer is a nitride and where the dielectric layer deposited prior to the CMP stop layer is polysilicon or anitride.

17. The method of claim 12 further comprising forming replacement inner nitride spacers on exposed sidewalls of the area previously occupied with said stack.

* * * * *